United States Patent [19]

Yoshida

[11] Patent Number: 4,929,888
[45] Date of Patent: May 29, 1990

[54] PIN ELECTRONICS DEVICE HAVING A PHASE ADJUSTMENT FUNCTION FOR IC TESTERS AND PHASE ADJUSTMENT METHOD THEREFOR

[75] Inventor: Kenji Yoshida, Gyoda, Japan

[73] Assignee: Advantest Corporation, Tokyo, Japan

[21] Appl. No.: 397,884

[22] Filed: Aug. 23, 1989

[30] Foreign Application Priority Data

Aug. 29, 1988 [JP] Japan ................... 63-215855

[51] Int. Cl.$^5$ .................. G01R 15/12; G01R 31/02
[52] U.S. Cl. .................. 371/25.1; 324/158 R; 371/1; 371/25.1; 328/55
[58] Field of Search ............ 324/73 R, 73 AT, 158 R; 371/15.1, 20.1, 20.2, 1, 25.1; 328/55; 307/269

[56] References Cited

U.S. PATENT DOCUMENTS

| | | | |
|---|---|---|---|
| Re. 31,056 | 10/1982 | Chau et al. ................... | 371/1 |
| 4,497,056 | 1/1985 | Sugamori ................... | 324/73 R |
| 4,635,256 | 1/1987 | Herlein ................... | 371/1 |
| 4,635,259 | 1/1987 | Schinabeck et al. ............ | 324/73 R |

*Primary Examiner*—Ernest F. Karlsen
*Assistant Examiner*—Vinh P. Nguyen
*Attorney, Agent, or Firm*—Staas & Halsey

[57] ABSTRACT

A pin electronics device for an IC tester, in which there are provided for each terminal of an IC under test a channel including a driver for applying a drive pulse to the terminal and a logical comparator for determining and holding the logic of a response signal from the terminal, and a difference between the delay of the path from a common reference strobe pulse output terminal to a strobe terminal of the logical comparator of each channel and the set-up time of the logical comparator is preset to be equal for all the channels. The drive pulse from the driver is determined in logic by the logical comparator at the timing of a reference strobe pulse, then the phase of the drive pulse is adjusted by a first variable delay element so that the reference strobe pulse may coincide with an edge of the drive pulse, and the phase adjusted drive pulse is provided to the logical comparator. At the same time, a strobe signal is applied to the logical comparator and the phase of the strobe signal is adjusted by a second variable delay element so that the edge of the drive pulse may coincide with the strobe signal.

7 Claims, 3 Drawing Sheets

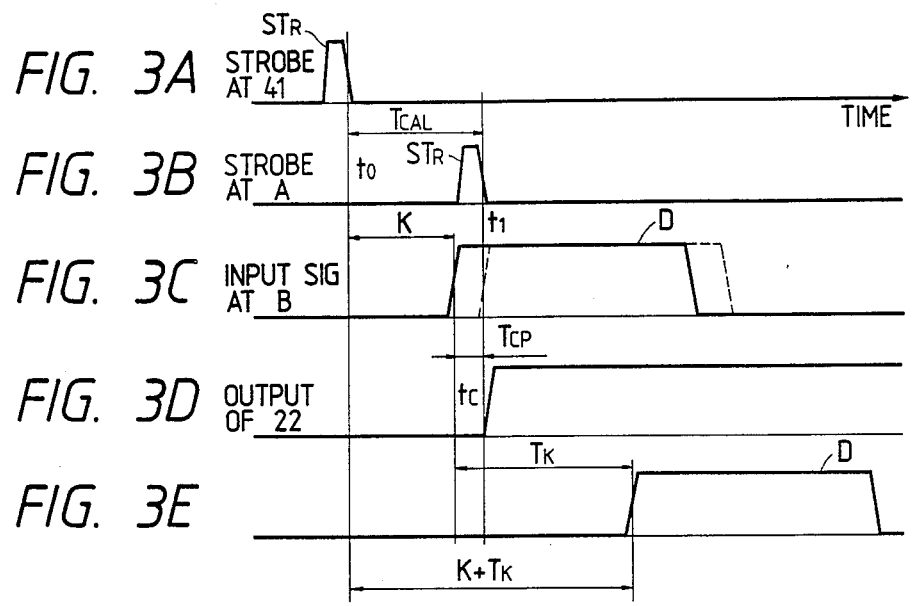
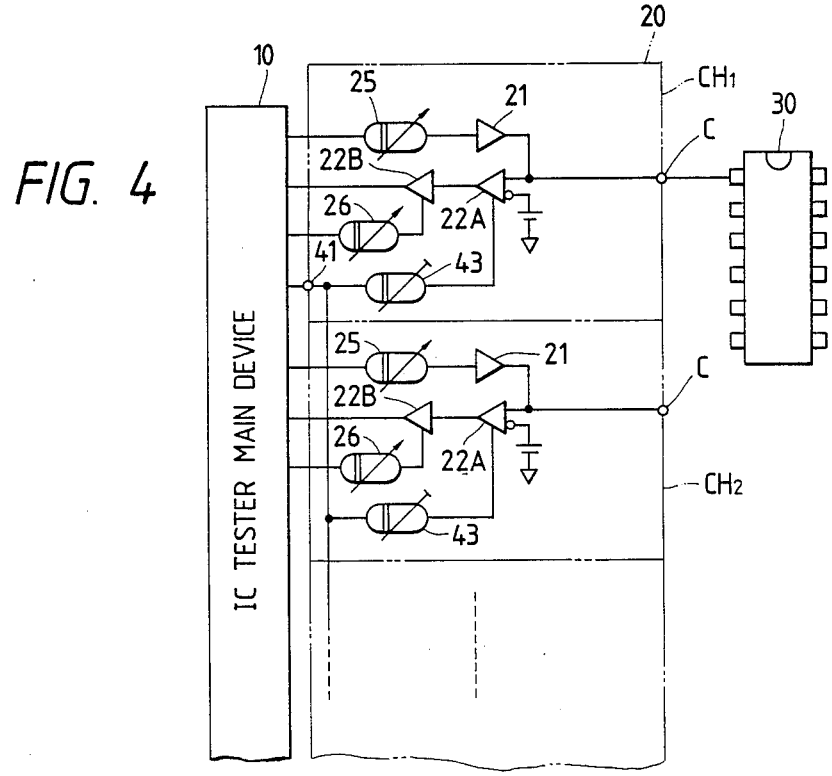

PIN ELECTRONICS DEVICE HAVING A PHASE ADJUSTMENT FUNCTION FOR IC TESTERS AND PHASE ADJUSTMENT METHOD THEREFOR

BACKGROUND OF THE INVENTION

The present invention relates to a phase adjustable pin electronics device for use in IC testers and a phase adjustment method therefor.

FIG. 1 shows the arrangement of a conventional IC tester as disclosed in U.S. Pat. No. 4,497,056. Reference numeral 10 indicates generally an IC tester main device, 20 a pin electronics device, and 30 an IC under test.

The pin electronics device 20 is provided with drivers 21 each providing a test pattern signal for each for channels $CH_l$ to $CH_n$ corresponding to respective terminals of the IC under test 30, and logical comparators 22 each determining whether or not a response out put signal from one of the terminals of the IC under test 30 has a predetermined level at predetermined timing.

The driver 21 and the logical comparator 22 for each channel are connected via a relay 24 to the corresponding terminal of the IC under test 30. Reference numerals 25 and 26 designate variable delay elements for skew adjustment in each channel. The variable delay elements 25 and 26 are provided in each channel for adjusting the phase of a drive pulse D to be applied to the corresponding terminal of the IC under test 30 and the phase of a strobe pulse ST to be applied to the logical comparator 22, thereby putting the phases (hereinafter referred to as skews) of the drive pulses D and the skews of the strobe pulses ST into agreement. The logical comparators 22 each compare the input signal level with a reference voltage at the fall of the strobe pulse ST, and output and hold a logical "1" or "0" until the next comparison is effected depending upon whether the former is higher or lower than the latter.

The pin electronics device 20 further includes a calibrator CAB which has a reference driver 27A and a reference logical comparator 27B which perform a reference operation with respect to the driver 21 and the logical comparator 22 provided for each channel. The reference driver 27A and the reference logical comparator 27B are used to adjust the variable delay elements 25 and 26 in such a manner as described below.

(1) Adjustment of Driver Skew

All the relays 24 are turned OFF and all calibration relays 29 ON, and the driver 21 of a desired channel to be adjusted is selected by a select switch 28.

The drive pulse D supplied from the selected driver 21 via the calibration relay and the select switch 28 is strobed by a reference strobe pulse $ST_R$ at the reference logical comparator 27B, and the delay amount of the variable delay element 25 in the selected channel is adjusted so as to bring the phase of the drive pulse into a fixed relation to the reference strobe pulse. That is, by gradually changing the delay amount of the variable delay element 25 and fixing it a at a value where the output logic of the reference logical comparator 27B reverses, the reference strobe pulse $ST_R$ which is applied to the reference logical comparator 27B is positioned at the edge of the drive pulse D which is output from the driver 21 in the selected channel. By this adjustment the skew of the driver 21 is set to a reference value. The skew adjustment for the drivers 21 of the other channels also similarly takes place after changing over the select switch 28 each time.

(2) Skew Adjustment of the Logical Comparator

In the skew adjustment of the logical comparator 22 the reference driver 27A outputs a reference drive pulse $D_R$ of a reference phase, the reference drive pulse $D_R$ is supplied to and strobed by the logical comparator 22 of the channel selected by the select switch 28, and the delay amount of the variable delay element 26 is adjusted to a value where the output logic of the logical comparator 22 reverses, whereby the strobe pulse D is positioned at the edge of the reference drive pulse $D_R$. The skews of the logical comparators 22 of the other channels are adjusted by similarly adjusting the delay amounts of the delay elements 26.

In the manner described above the prior art performs the skew adjustment for the drivers 21 and the logical comparators 22 provided in the respective channels $CH_l$ through $CH_n$. The numbers of drivers 21 and the logical comparators 22 are very large, because they are provided corresponding to respective terminals of the IC under test 30. Consequently, it takes much time to adjust the drivers 21 and the logical comparators 22 one by one. Furthermore, the additional provision of the select switch 28 and the calibration relays 29 inevitably increases the physical size of the device. Moreover, since the calibration relay 29 is connected to the connection point of the driver 21 and the logical comparator 22 of each channel, the electrostatic capacitance of the calibration relay 29 degrades the signal waveform which is provided to the IC under test 30 and the waveform of a response signal which is input into the logical comparator 22 from the IC under test 30. Besides, since the line length from the connecting point between each calibration relay 29 and a corresponding channel to the select switch 28 differs with the channels, an error is produced even if the skew adjustment is made.

SUMMARY OF THE INVENTION

It is therefore an object of the present invention to provide a phase adjustment device which is small in size and permits the skew adjustment in a short time with a higher degree of precision but without distorting signals.

According to the present invention, an OR gate is provided in association with the logical comparator of each channel corresponding to one of respective terminals of an IC under test and a reference strobe pulse of a reference phase is applied via such OR gates to all the logical comparators at the same time.

Then each driver provides a drive pulse and its phase is adjusted by adjusting a variable delay element connected to the driver system so that the edge of the drive pulse may agree with the position of the reference strobe pulse.

By such adjustment the drive pulses from the respective drivers are brought into agreement with the phase of the reference strobe pulse and the skews of the respective channels are made equal to one another.

Next, the supply of the reference strobe pulse is cut off but instead the skew-adjusted drive pulse is output from each driver. Each logical comparator adjusts a variable delay element inserted in the strobe pulse supply line so that the position of the strobe pulse may agree with the edge of the drive pulse. By this, the phase of the strobe pulse in each logical comparator is put into agreement with the phase of the drive pulse, and as a result, the skews of the strobe pulses of the respective channels are made equal to one another.

As described above, according to the present invention, a reference strobe pulse of a reference phase is prepared for the logical comparator of each channel corresponding to one of the terminals of the IC under test, and the skew adjustment of the driver can be effected through use of the reference strobe pulse and the logical comparator. Since this skew adjustment can be performed for all the channels at one time, the adjustment can be achieved in a short time.

Moreover, the skew of the strobe pulse which is applied to the logical comparator can be adjusted utilizing the drive pulse which is yielded from the skew-adjusted driver.

This skew adjustment of the strobe pulse can also be achieved for all the channels at the same time. Hence this skew adjustment can also be performed in a short time.

BRIEF DESCRIPTION OF THE DRAWINGS

FIGS. 3A through 3E are waveform diagrams for explaining skew adjustment; and

FIG. 4 is a block diagram illustrating another embodiment of the present invention.

DESCRIPTION OF THE PREFERRED EMBODIMENTS

Figure 1:
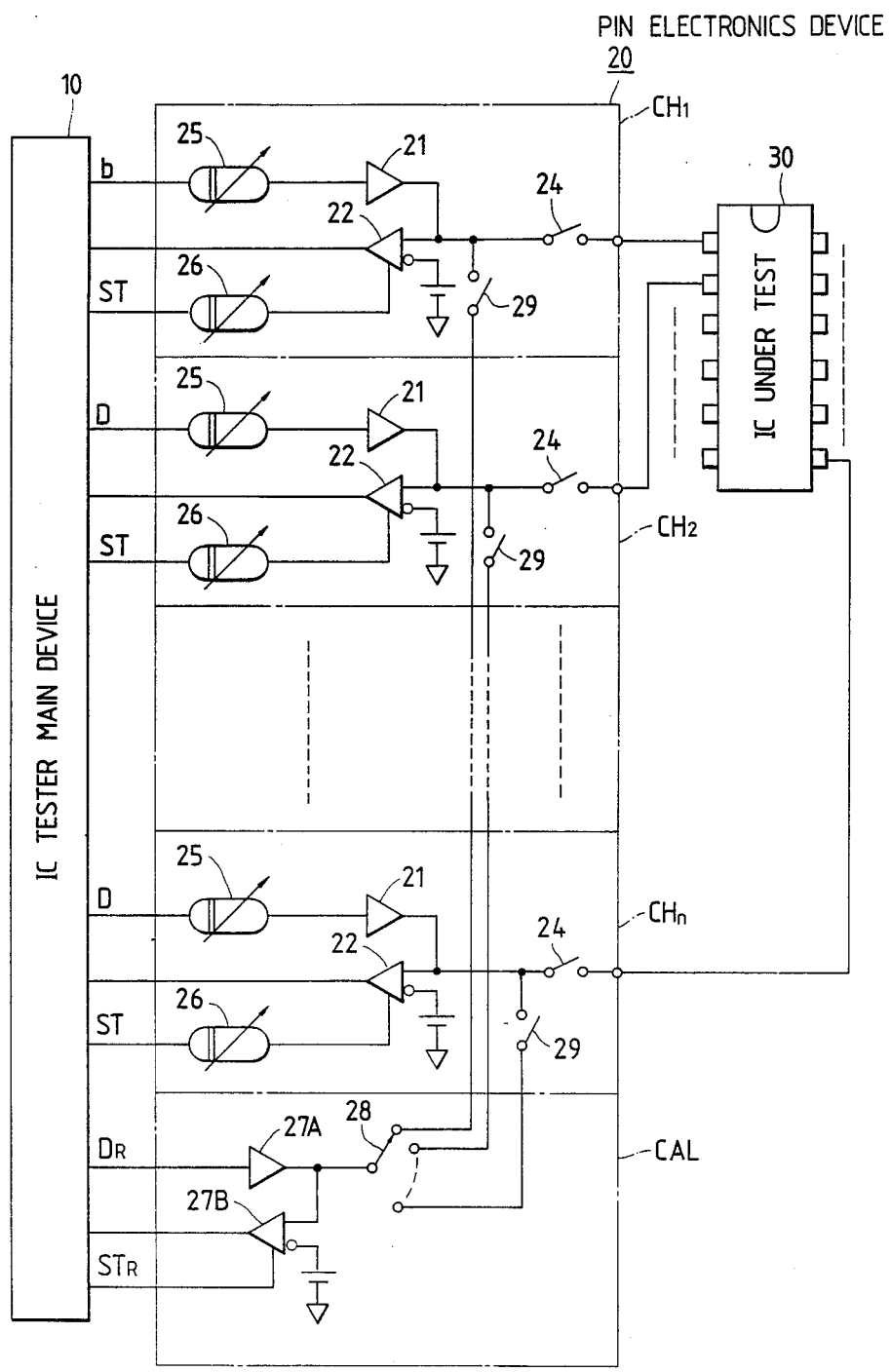
FIG. 1 is a block diagram showing a prior art example.
Figure 2:
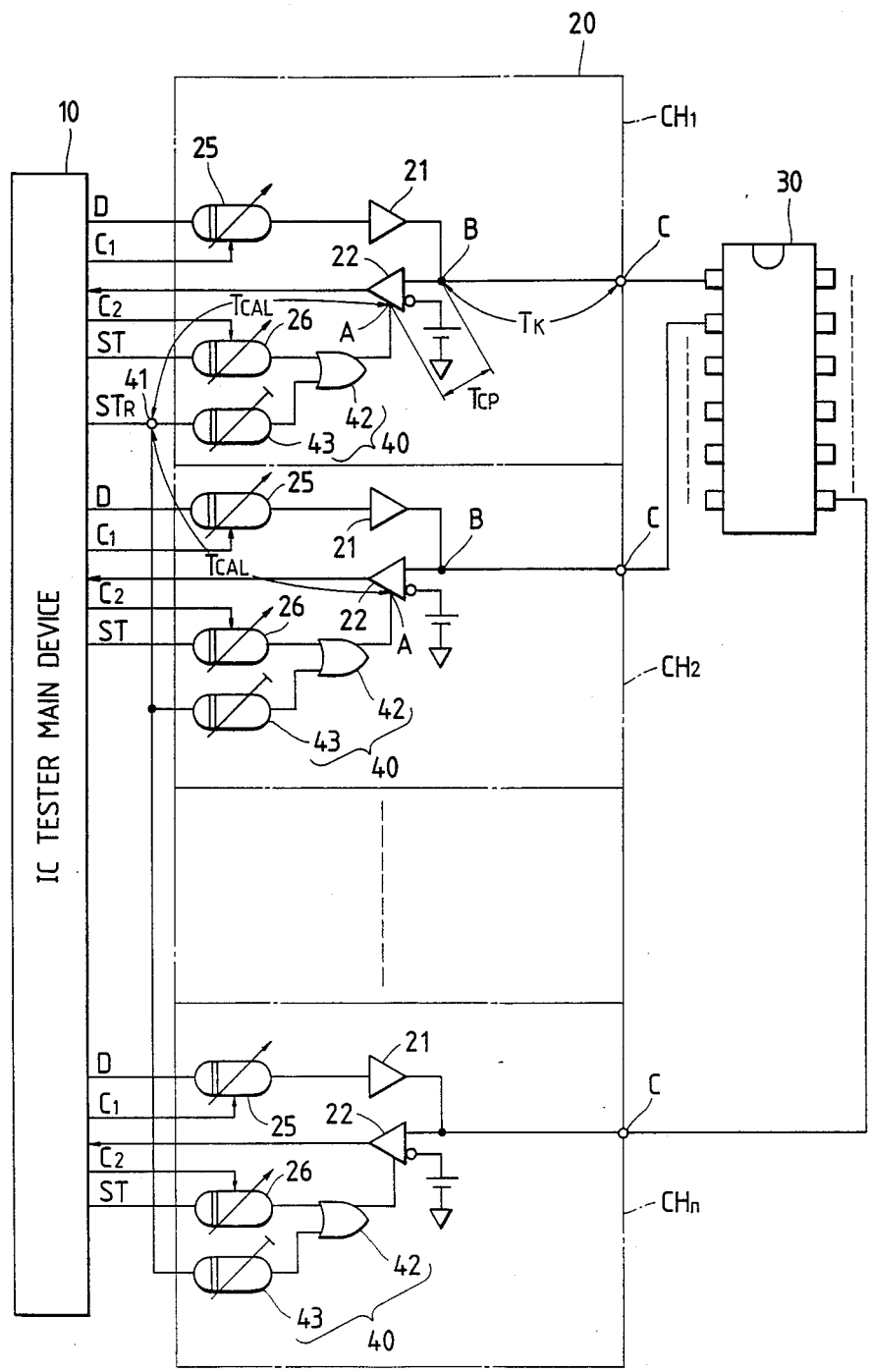
FIG. 2 is a block diagram illustrating an embodiment of the present invention.

FIG. 2 illustrates in block form an embodiment of the present invention. The same reference numerals are used as those in connection with FIG. 1, where the components are the same. In the present invention a reference strobe pulse supply path 40 is provided for the logical comparator 22 in each channel. The reference strobe pulse supply path 40 comprises an OR gate 42 provided in association with the logical comparator 22 and a variable delay element 43 connected between the OR gate 42 and a strobe pulse output terminal 41 of the IC tester main device 10.

The amount of delay of the reference strobe pulse, which occurs in the path from the strobe pulse output terminal 41 to a strobe terminal A of the logical comparator 22 through the reference strobe pulse supply path 20 in each channel, is preset to a value $T_{CAL}$. The setting of this delay amount $T_{CAL}$ is effected by adjusting the variable delay element 43 in the course of manufacture of the device so that $T_{CAL} - T_{CP} = K$ (constant), where $T_{CP}$ is the amount of delay (commonly referred to as a set-up time) between the connection point B of the driver 21 and the logical comparator 22 and the strobe pulse input terminal A of the logical comparator 22. The above-mentioned relation is held unchanged thereafter. Further, the device is produced so that the amount of delay $T_K$ in the path from the connection point B to pin electronics input/output terminal C is also equal among the channels $CH_I$ through $CH_n$.

The above-mentioned adjustment is to ensure that the timing $t_c$ of logical comparison by the logical comparator 22 in each channel, for which its set-up time $T_{CP}$ has been compensated for, is set to the same position for all the channels relative to the output timing $t_1$ of the reference strobe pulse $ST_R$ at the reference strobe output terminal 41 shown in FIG. 3A. In other words, the reference strobe pulse $ST_R$ at the terminal 41 shown in FIG. 3A arrives at the strobe input terminal A of the logical comparator 22 after the delay time $T_{CAL}$ as shown in FIG. 3B and, at the fall time $t_1$ of the reference strobe pulse $ST_R$, the logical comparator 22 performs the logical comparison of a signal applied to its input terminal B (the connection point B). However, since the signal to the input terminal B is delayed for the set-up time $T_{CP}$ owing to the internal delay (i.e. the set-up time) of the logical comparator 22 before it is subjected to the level determination, (i.e. logical comparison), the logical comparison at the fall of the strobe pulse at the time $t_1$ means that the level of the signal which is applied to the input terminal B is determined at the time $t_c$ earlier than the time $t_1$ by the set-up time $T_{CP}$ as depicted in FIGS. 3B and 3C. To adjust $T_{CL} - T_C = K$ constant in the course of manufacture as mentioned previously means that the logical comparators 22 in the channels $CH_1$ through $CH_n$ all perform the level determination at the same time point $t_c$ with respect to the reference strobe pulse $ST_R$.

Next, a description will be given of the skew adjustment which is performed by an operator of the device.

(1) Adjustment of Driver Skew

A driver pulse D is applied to each driver 21 and a reference strobe pulse $ST_R$ is provided to the strobe pulse output terminal 41. In this state the delay amount of the variable delay element 25 is adjusted so that the reference strobe pulse $ST_R$ falls at an edge of the drive pulse in the logical comparator 22. That is to say, the IC tester main device 10 always monitors the output logic of the logical comparator 22 and yields a control signal $C_1$ which causes an increase (or decrease) in the delay amount of the variable delay element 25 until the output logic of the logical comparator 22 reverses. FIG. 3C shows the waveform of the drive pulse D adjusted in its delay so that the logical comparator output reverses at the fall of the reference strobe pulse $ST_R$ at the time $t_1$ as shown in FIGS. 3B and 3D. By this adjustment, the phase time of the delay-adjusted drive pulse D at the pin electronics input/output terminal C with respect to the reference strobe pulse $ST_R$ at the terminal 41 (FIG. 3A) is $T_{CAL} - T_{CP} + T_K =$ constant as depicted in FIG. 3E. This applies to all the drivers 21.

(2) Skew Adjustment of the Logical Comparator

No reference strobe pulse $ST_R$ is produced but instead the drive pulse D is applied to each driver 21. Since the drive pulses D which are provided from the drivers 21 to the connection points B have all been adjusted to have the same skew by the previous adjustment, the drive pulses D are applied to the logical comparators 22 at the same timing.

The delay amount of the variable delay element 26 is adjusted so that the fall of the strobe pulse ST may coincide with the edge of the drive pulse D. This adjustment is also conducted by a control signal $C_2$ which is provided from the IC tester main body 10 as in the case of the afore-mentioned adjustment of the variable delay element 25. The skew adjustment of the strobe pulse ST which is applied to the logical comparator 22 in each channel terminates with this adjustment.

FIG. 4 illustrates a modified form of the principal part of the present invention, in which two logical comparators 22A and 22B are provided for each channel. The variable delay elements 43, 25 and 26 are adjusted in the same manner as described previously with regard to FIG. 2. In this example, however, during adjustment of the variable delay element 26 and during testing of the IC 30 the IC tester main device 10 outputs a continuous "1" level to the output terminal 41 and the logical comparator 22A makes a level comparison of its input signal at all times and outputs the result of comparison as it is. That is to say, the logical comparator 22A of the preceding stage operates as an ordinary level comparator which has no hold function, whereas the logical comparator 22B of the succeeding stage operates as a latch which holds the result of logical comparison from the preceding stage at the strobe timing.

With such an arrangement, the OR gates 42 in FIG. 2 can be left out and the elements that are disposed in close proximity to the input/output terminal C of each channel is three, i.e. the driver 21, the logical comparator 22 and the OR gate 42, but in the embodiment shown in FIG. 4 the number of such elements can be reduced to two, i.e. the driver 21 and the logical comparator 22A.

The structure of the modified form depicted in FIG. 4 permits the reduction of the number of elements to be disposed near the input/output terminals C as mentioned above, and hence affords a margin of space accordingly; so that the number of channels can be increased in accordance with an increase in the number of terminals of the IC under test 30.

As described above, the present invention adopts an arrangement in which no calibration switch is connected to the connection point B of the driver 21 and the logical comparator 22, and this eliminates the possibility of degrading the waveforms of the drive pulse which is applied to the IC under test 30 from the drive 21 and the response signal which is applied to the logical comparator 22 from the IC under test 30. Hence the IC under test 30 can be tested correctly.

Since the skew adjustment can be executed at one time for all terminals, the time necessary for the skew adjustment can be reduced to 1/n (where n is the number of terminals of the IC under test 30) as compared with the time needed in the prior art. This affords reduction of the time for test and permits efficient testing of IC's. The present invention is therefore of great utility in practical use.

It will be apparent that many modifications and variations may be effected without departing from the scope of the novel concepts of the present invention.

What is claimed is:

1. A pin electronics device comprising:
    a driver provided for each of a plurality of channels, for supplying a drive signal to the corresponding terminal of an IC under test;
    a logical comparator means provided in said each channel, which has an input connected to the output of said driver, receives a response signal from said corresponding terminal of said IC under test, and determines the logic of its level;
    a first variable delay means provided in said each channel, for adjusting the phase of said drive signal which is output from said driver in said each channel;
    a second variable delay means inserted in a path for applying therethrough a reference strobe signal from a common reference strobe output terminal to a strobe terminal of said logical comparator means of said each channel, for adjusting the phase of said reference strobe signal; and
    a third variable delay means provided in said each channel, for adjusting the phase of a strobe pulse which is applied to said strobe terminal of said logical comparator means.

2. The pin electronics device of claim 1 wherein a difference between the amount of delay in said path from said common reference strobe output terminal to said strobe terminal of said logical comparator means of said each channel and a set-up time of said logical comparator means is set to be the same for all channels.

3. The pin electronics device of claim 2 wherein the outputs of said second and third variable delay means in said each channels are connected via an OR gate to said strobe terminal of said logical comparator means in the same channel.

4. The pin electronics device of claim 2 wherein said logical comparator means in said each channel includes a logical comparator which has an input connected to the output of said driver corresponding thereto and a first strobe terminal for receiving the output of said second variable delay means corresponding thereto, and a hold means which is connected to the output of said logical comparator and holds the result of comparison by said logical comparator in response to said strobe pulse which is applied from the output of said third variable delay means.

5. The pin electronics device of claim 1 wherein the outputs of said second and third variable delay means in said each channels are connected via an OR gate to said strobe terminal of said logical comparator means in the same channel.

6. The pin electronics device of claim 1 wherein said logical comparator means in said each channel includes a logical comparator which has an input connected to the output of said driver corresponding thereto and a first strobe terminal for receiving the output of said second variable delay means corresponding thereto, and a hold means which is connected to the output of said logical comparator and holds the result of comparison by said logical comparator in response to said strobe pulse which is applied from the output of said third variable delay means.

7. A phase adjustment method for a pin electronics device which is equipped with plurality of drivers and a plurality of logical comparators and in which said drivers each provide a drive signal to the corresponding terminal of an IC under test and a response output signal from each terminal of said IC under test is determined in level by the corresponding logical comparator at the timing of supply of a strobe pulse and then input into an IC tester, said method comprising:
    a step wherein a reference strobe pulse is applied to all of said logical comparators, and at the same time, a drive pulse is applied from each of said drivers to the corresponding logical comparator and then a variable delay element connected in cascade to said driver is adjusted so that said reference strobe pulse coincides with an edge of said drive pulse, whereby the phase of said drive pulse is adjusted; and
    a step wherein said adjusted drive pulse from said each driver is regarded as a reference signal and the phase of a strobe pulse to be applied to the corresponding logical comparator is adjusted so that a strobe signal to be applied to said each logical comparator coincides with an edge of said reference signal.

* * * * *